(12) United States Patent
Kazuma (10) Patent No.: US 7,250,803 B2
(45) Date of Patent: Jul. 31, 2007

(54) PLL OUTPUT CLOCK STABILIZATION CIRCUIT

(75) Inventor: Shingo Kazuma, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 166 days.

(21) Appl. No.: 11/153,487

(22) Filed: Jun. 16, 2005

(65) Prior Publication Data

US 2006/0017475 A1    Jan. 26, 2006

(30) Foreign Application Priority Data

Jul. 23, 2004    (JP) .............................. 2004-215200

(51) Int. Cl.
*G06F 1/04*    (2006.01)

(52) U.S. Cl. ...................... 327/291; 327/147

(58) Field of Classification Search ...................... None
See application file for complete search history.

(56) References Cited

U.S. PATENT DOCUMENTS 6,624,681 B1 *    9/2003    Loyer et al. ................ 327/297
6,782,486 B1 *    8/2004    Miranda et al. ............ 713/601
2002/0087904 A1 *    7/2002    Cai ............................ 713/322
2004/0000939 A1 *    1/2004    Meguro ...................... 327/160

FOREIGN PATENT DOCUMENTS

JP    11-069263    3/1999

OTHER PUBLICATIONS

Motrola Users Manual "On-chip Clock Synthesis (OCCS)", published in Jan. 2001, specifically Figure 6-3 on p. 6-7 and section 6.8.1.3, "PLL Frequency Lock Detector", on p. 6-9 in the manual.

* cited by examiner

*Primary Examiner*—Kenneth B. Wells
*Assistant Examiner*—Cassandra Cox
(74) *Attorney, Agent, or Firm*—Nixon Peabody LLP; Donald R. Studebaker (57) ABSTRACT

A circuit includes: a PLL circuit which multiplies a reference clock by a multiplication factor and outputs a PLL clock; a first counter which counts up with the PLL clock for a fixed period of time; a comparator which compares a count value of the first counter with the multiplication factor; a second counter which counts up the number of times the comparison values have been matched for the fixed period of time; and an output unit which generates an enable signal when a count value of the second counter reaches the number of times the circuit waits for stability, and opens a gate to transmit the PLL clock in response to the enable signal.

4 Claims, 8 Drawing Sheets

PLL OUTPUT CLOCK STABILIZATION CIRCUIT

BACKGROUND OF THE INVENTION

1. Field of the Invention

The present invention relates to a phase locked loop (PLL) output clock stabilization circuit that allows the PLL circuit to output a PLL clock signal after the operation thereof has become stable (locked) and to supply the PLL clock signal to circuits, for example, logic circuits provided in the next stage.

2. Description of the Related Art

Conventional PLL circuit technologies are described in, for example, Japanese Patent application Kokai No. H11-69263 and Motorola Users Manual "On-chip Clock Synthesis (OCCS)" published in January 2001, specifically FIG. 6-3 on page 6-7 and section 6.8.1.3 "PLL Frequency Lock Detector" on page 6-9 in the manual.

Figure 6:
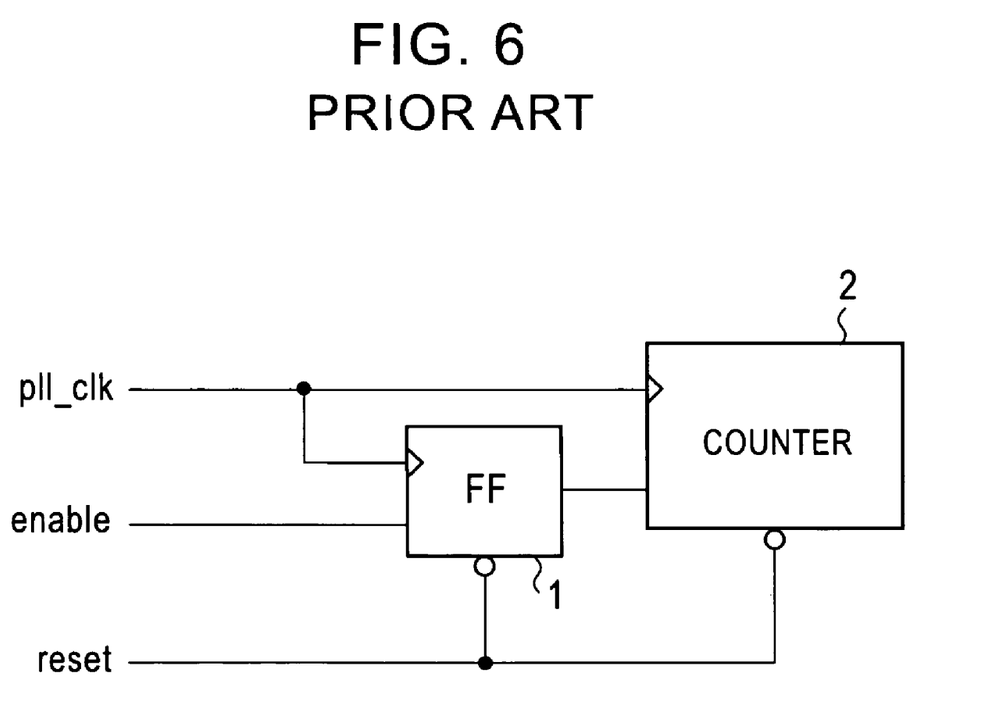
FIG. 6 is a basic circuit block diagram of a conventional frequency counter.
Figure 7:
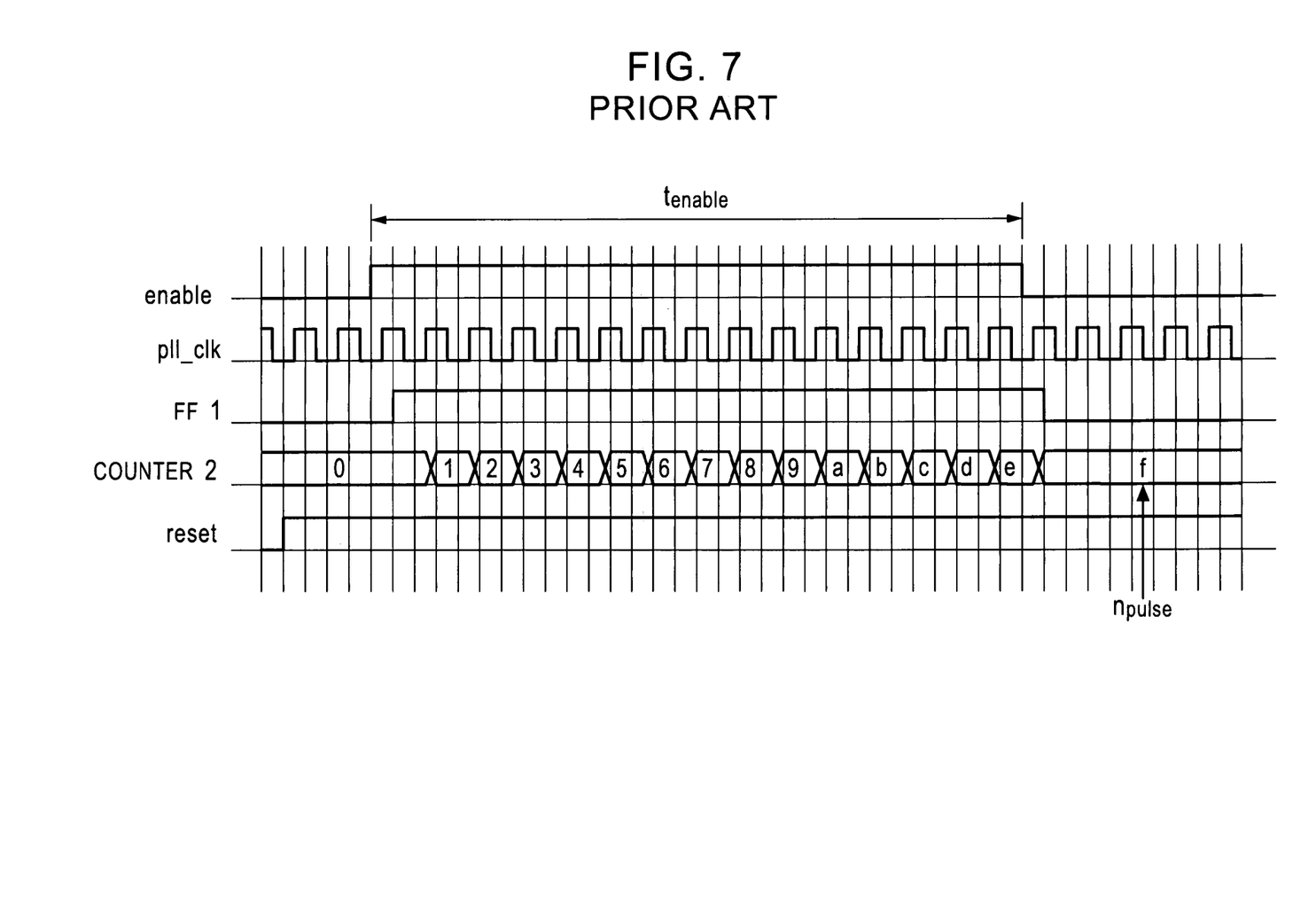
FIG. 7 is a timing chart showing the operation of the circuit in FIG. 6.

FIG. 6 is a basic circuit block diagram of a conventional frequency counter. FIG. 7 is a timing chart showing the operation of the circuit in FIG. 6.

A PLL circuit takes a certain time to output a clock pll_clk having an expected frequency after it has received a source clock (clk) or a reference clock. Therefore, when a clock pll_clk generated by a PLL circuit is used, a waiting time is required to obtain a stable clock pll_clk having an expected frequency.

As described in the above-described references, for example, one of conventional methods for detecting that the PLL circuit has been stabilized is to count a PLL output clock pll_clk by using a counter and determine its stability from the count value. Another method is to take a PLL output clock pll_clk out from the large-scale integrated circuit (LSI) and determine by observing the waveform of the PLL output clock.

In the latter method, if the frequency of a PLL output clock pll_clk is observed in a consecutive period, it will be found that the frequency continues to match an expected frequency from a certain time point. Therefore, it can be determined that the PLL circuit has entered a stable state at that time point.

To measure frequency F using the frequency counter comprising a flip-flop (hereinafter, referred to as "FF") 1 and a counter 2 as shown in FIG. 6, the number of pulses $n_{pulse}$ of a clock pll_clk that arrives over a certain or fixed period of time $t_{enable}$ during which an enable signal "enable" of the FF 1 is high is counted by the counter 2 as shown in FIG. 7. Then, the frequency F is calculated by the following equation.

$$F = 1/T = n_{pulse}/t_{enable}$$

A PLL output clock stabilization circuit is also proposed so that logic circuits or other circuits in the next stage do not malfunction due to an unstable PLL output clock pll_clk generated before the PLL circuit is stabilized.

Figure 8:
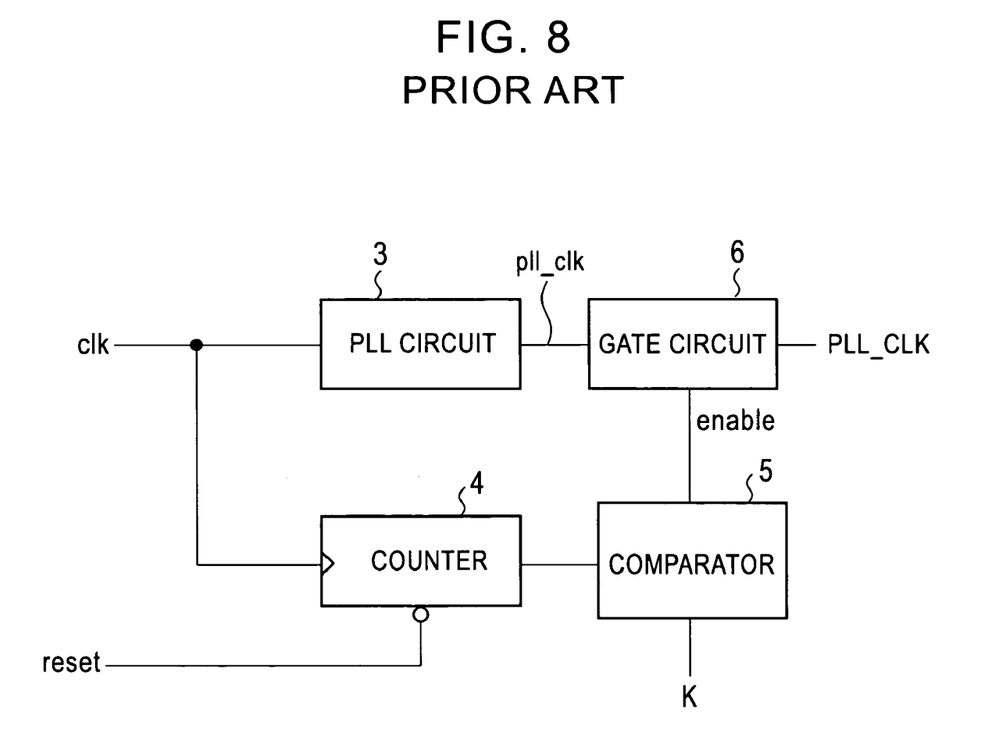
FIG. 8 is a circuit block diagram showing an example of a conventional PLL output clock stabilization circuit.

FIG. 8 is a circuit block diagram showing an example of a conventional PLL output clock stabilization circuit.

The PLL output clock stabilization circuit comprises a PLL circuit 3, a counter 4, a comparator 5, and a gate circuit 6. The PLL circuit 3 multiplies a source clock (clk) by a predetermined multiplication factor to output a PLL clock pll_clk. The counter 4 counts up with the source clock (clk) and is reset by a reset signal "reset." The comparator 5 is connected to the output of the counter 4. The gate circuit 6 is connected to the output of the PLL circuit 3.

To use the output clock pll_clk of the PLL circuit 3, first the LSI is evaluated and a time required for its stable operation is measured externally. Next, based on this time, a fixed value with a certain margin is determined and set to the comparator 5 as the number of times K the circuit waits for stability. The number of pulses of the source clock (clk) is counted by the counter 4 and this counted number is input to the comparator 5. In the comparator 5, when the counted number reaches the number of times K the circuit waits for stability, it outputs an enable signal "enable" to open the gate circuit 6, by which the PLL clock pll_clk has been blocked. A stable PLL clock PLL_CLK is thereby output from the gate circuit 6 and supplied to logic circuits and other circuits in the next stage.

The conventional PLL output clock stabilization circuit shown in FIG. 8, however, has the following problems.

The PLL circuit 3 has the number of times K the circuit waits for stability, which fluctuates due to the variations of operation temperature and voltage, and element characteristics. Therefore, when the number of times K the circuit waits for stability is set to a fixed value as in the circuit in FIG. 8, the time from when the PLL circuit 3 is stabilized until it is actually used may be wasted or, contrarily, the PLL circuit 3 may be used before it is stabilized.

SUMMARY OF THE INVENTION

To solve the prior art problems, in the PLL output clock stabilization circuit of the present invention, a circuit which checks a multiplication factor or a division ratio of the PLL circuit is provided in the LSI and the like to make it possible to determine whether the operation of the PLL circuit has been stabilized.

The PLL output clock stabilization circuit of the present invention includes: a PLL circuit which multiplies a reference clock by a fixed or variable multiplication factor and outputs a PLL clock; a first counter which counts up with the PLL clock for a fixed period of time; a comparator which compares a count value of the first counter with the fixed or variable multiplication factor; a second counter which counts up the number of times the comparison values of the comparator have been continuously matched for the fixed period of time; and output means which generates an output enable signal when a count value of the second counter reaches a fixed value, and opens a gate, by which the PLL clock has been blocked, to transmit the PLL clock in response to the output enable signal.

Another PLL output clock stabilization circuit of the present invention includes: a PLL circuit which multiplies a reference clock by a fixed or variable multiplication factor and outputs a PLL clock; a divider which receives the PLL clock and divides the PLL clock by the fixed or variable multiplication factor; detection means which receives an output clock of the divider and the reference clock, counts the output clock of the divider and the reference clock separately to obtain a difference value of these two count values, and compares the difference value with a difference value obtained immediately before the difference value to detect a state that the output clock of the divider and the reference clock have the same cycles; count means which receives the reference clock and counts up the number of times the state has been continuously detected, with the reference clock on the basis of an output signal of the detection means; and output means which generates an output enable signal when a counter value of the count means reaches a fixed value, and opens a gate, by which the PLL clock has been blocked, to transmit the PLL clock in response to the output enable signal.

According to the PLL output clock stabilization circuit of the present invention, since a fixed or variable multiplication factor is set to a fixed value, the frequency of the PLL clock is measured by the second counter or the output means at each predetermined cycle of the reference clock. Therefore, LSI or the like provided inside the PLL output clock stabilization circuit can detect that the PLL circuit has been stabilized.

Although the PLL output clock stabilization circuit according to an embodiment of the present invention cannot operate normally when the multiplication factor N equals one (N=1), another embodiment of the invention can operate normally due to the inserted divider and furthermore can work by dividing the reference clock even when adopting the multiplication factor which becomes an integer number by being multiplied by an integer number.

The clock blocking means can stop the operation of the part of the circuit blocks used for detecting the stability of the PLL circuit after the PLL circuit has been stabilized, thereby preventing the power consumption from increasing when the PLL clock is used.

The PLL output clock stabilization circuit of the invention comprises a PLL circuit, first and second counters, a comparator, and output means.

The PLL circuit multiplies a reference clock by a fixed or variable multiplication factor and outputs a PLL clock. The first counter counts up with the PLL clock for a fixed period of time. The comparator compares a count value of the first counter with the fixed or variable multiplication factor. The second counter counts up the number of times the comparison values of the comparator have been continuously matched for the fixed period of time. The output means generates an output enable signal when a counter value of the second counter reaches a fixed value, and opens a gate, by which the PLL clock has been blocked, to transmit the PLL clock in response to the output enable signal.

The fixed period of time is set by, for example, a FF which receives the PLL clock and the reference clock to synchronize the reference clock with an edge of the PLL clock and a divider which divides an output signal of the FF.

The output of the PLL circuit is connected to clock blocking means. The clock blocking means blocks the supply of the PLL clock and the reference clock to the FF and the first counter by an inverted signal of the output enable signal.

The output means comprises a comparator which compares a count value of the second counter with the fixed value to output the output enable signal when these comparison values are matched and a gate circuit which opens a gate, by which the PLL clock has been blocked, in response to the output enable signal.

Another PLL output clock stabilization circuit of the invention comprises a PLL circuit, a divider, detection means, count means, and output means.

The PLL circuit multiplies a reference clock by a fixed or variable multiplication factor and outputs a PLL clock. The divider receives the PLL clock and divides the PLL clock by the fixed or variable multiplication factor. The detection means receives an output clock of the divider and the reference clock, counts the output clock of the divider and the reference clock separately to obtain a difference value of these two count values, and compares this difference value with a difference value obtained immediately before this difference value to detect a state that the output clock of the divider and the reference clock have the same cycles. The count means receives the reference clock and counts up the number of times the state has been continuously detected, with the reference clock on the basis of an output signal of the detection means. The output means generates an output enable signal when a counter value of the count means reaches a fixed value, and opens a gate, by which the PLL clock has been blocked, to transmit the PLL clock in response to the output enable signal.

The detection means comprises, for example: a first counter which receives an output clock of the divider and counts up with the output clock of the divider; a second counter which receives the reference clock and counts up with the reference clock; a difference circuit which detects a difference between the count values of the first and second counters and outputs a difference value; a FF which receives the reference clock and latches the difference value with the reference clock; and a comparator which compares the difference value with an output signal of the FF. The count means comprises a third counter which receives the reference clock and counts up with the reference clock when the comparison result of the comparator is a match.

The output of the PLL circuit is connected to clock blocking means. The clock blocking means blocks the supply of the PLL clock and the reference clock to the divider, the second counter, the FF, and the third counter by an inverted signal of the output enable signal.

The output means comprises a comparator which compares a count value of the third counter with the fixed value to output the output enable signal when these comparison values are matched and a gate circuit which opens a gate, by which the PLL clock has been blocked, in response to the output enable signal.

DETAILED DESCRIPTION OF THE INVENTION

FIRST EMBODIMENT (Structure)

Figure 1:
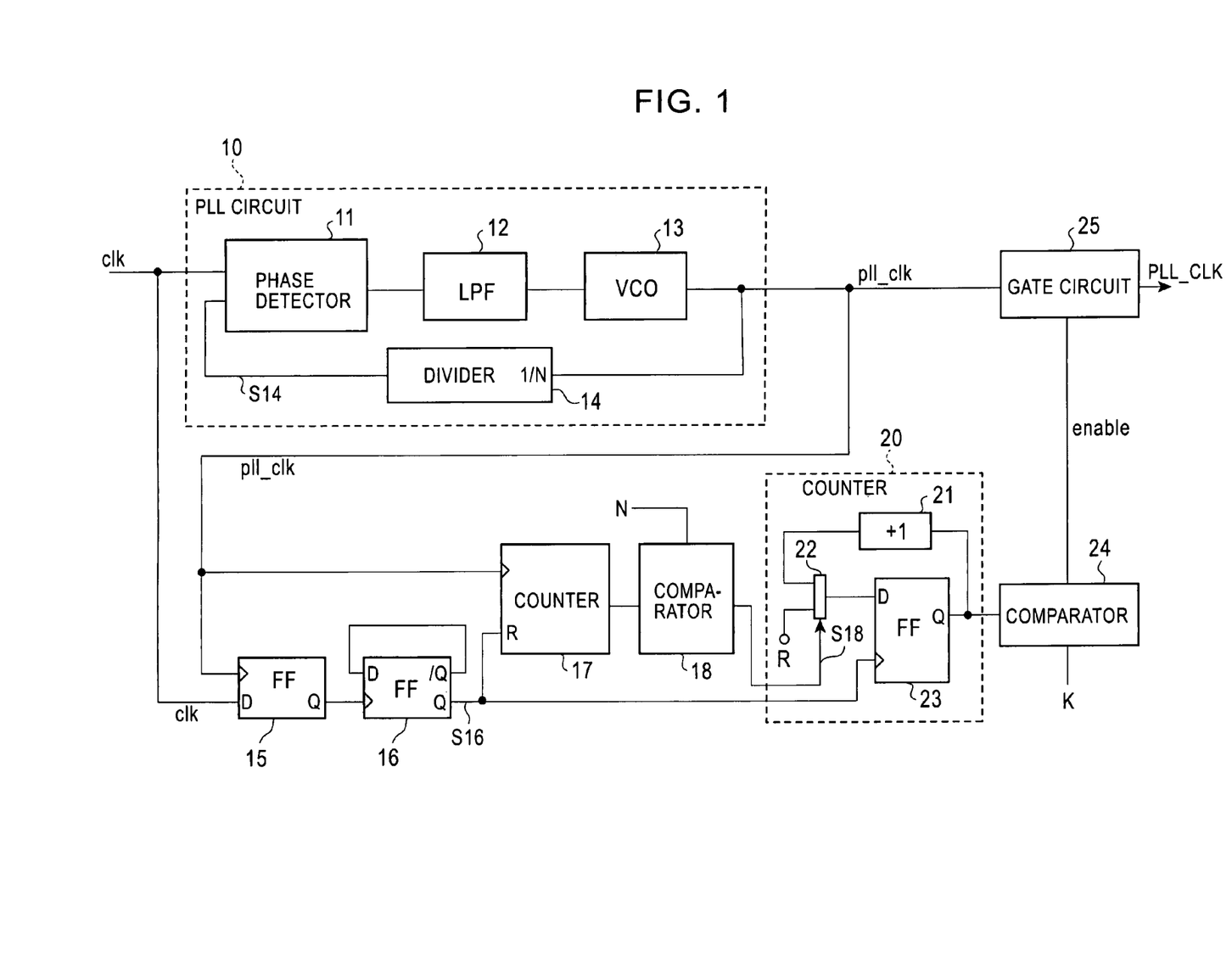
FIG. 1 is a block diagram schematically showing the PLL output clock stabilization circuit according to a first embodiment of the present invention.

FIG. 1 is a block diagram schematically showing a PLL output clock stabilization circuit according to a first embodiment of the present invention.

The PLL output clock stabilization circuit has a PLL circuit 10 which multiplies a source clock (clk), which is a reference clock, by a division ratio (or multiplication factor) having a fixed value to output a PLL clock pll_clk. The PLL circuit 10 comprises a phase detector 11, a low-pass filter 12 (hereinafter, referred to as "LPF"), a voltage controlled oscillator 13 (hereinafter, referred to as "VCO"), and a divider 14. The phase detector 11 detects a phase difference between the source clock (clk) and a feedback clock S14 to generate a voltage proportional to the phase difference. The LPF 12 smoothes the output voltage of the phase detector 11 and takes out a voltage component proportional to the phase difference. The VCO 13 outputs a PLL clock pll_clk with an oscillation frequency controlled by the output voltage (or control voltage) of the LPF 12. The divider 14 divides the PLL clock pll_clk by a division ratio (or multiplication factor) N and feeds back a feedback clock S14 to the phase detector 11.

The output of the PLL circuit 10 is coupled to a gate circuit 25, which is one of the components of output means, a fixed or predetermined period setting circuit, and a first counter 17. The fixed period setting circuit comprises a FF 15 which latches the source clock (clk) on the rising edge of the PLL clock pll_clk to synchronize the source clock (clk) with the PLL clock pll_clk and a divider 16 which divides the output of the FF 15 by two. The divider 16 comprises a FF having a clock input terminal connected to an output terminal Q of the FF 15 in the previous stage, an inverted output terminal /Q, a data input terminal D, both of which are connected to each other in a feedback fashion, and an output terminal Q connected to a reset terminal R of the counter 17.

The counter 17 is an up-counter which counts up on the rising edge of the PLL clock pll_clk and is reset when a synchronous reset signal S16 output from the output terminal Q of the divider 16 is input to the reset terminal R. The output of the counter 17 is connected to a comparator 18. The comparator 18 compares a count value of the counter 17 with a fixed PLL multiplication factor N, and outputs a count enable signal S18 according to the comparison result (S18 is a logical zero "0" if the comparison result is a mismatch and a logical one "1" if it is a match). The output of the comparator 18 is connected to a second counter 20.

The counter 20 is an up-counter with synchronous reset; it counts up with the synchronous reset signal S16 output from the divider 16 when the count enable signal S18 output from the comparator 18 is a logical value "1", and is reset when the count enable signal S18 is a logical value "0". The counter 20 comprises, for example, a plus one adder 21, a selector 22 with two inputs and one output, and a FF 23. The plus one adder 21 adds one (+1) to an output signal from an output terminal Q of the FF 23 and outputs it to one of the two inputs of the selector 22. The other input of the selector 22 always receives a logical value "0". The selector 22 selects and outputs this logical value "0" when the count enable signal S18 input to the reset terminal R is a logical value "0", and selects and outputs the output signal from the plus one adder 21 when the signal S18 is a logical value "1". The output terminal of the selector 22 is connected to the data input terminal D of the FF 23. The FF 23 captures the output signal of the selector 22 received from its data input terminal D in synchronization with the rising edge of the synchronous reset signal S16 received from its clock input terminal, and has an output terminal Q connected to the output means.

The output means comprises a comparator 24 and the gate circuit 25. The comparator 24 compares a count value of the counter 20 with the number of times K the circuit waits for stability, and outputs an output enable signal "enable" if these comparison values are matched. The gate circuit 25 opens a gate, by which the PLL clock pll_clk has been blocked, in response to the output enable signal "enable" and outputs a stable PLL clock PLL_CLK.

(Operation)

Figure 2:
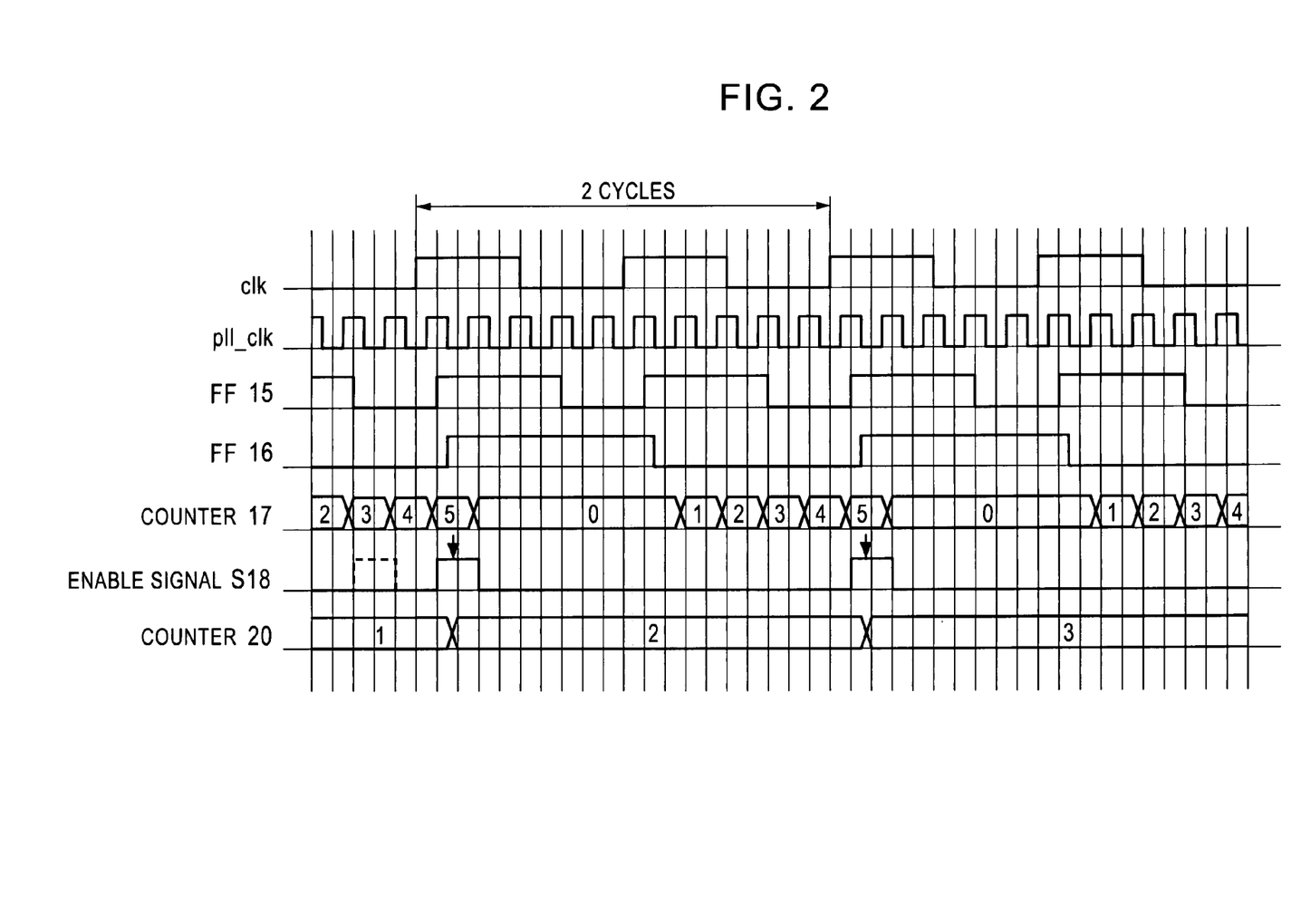
FIG. 2 is a timing chart showing the operation of the circuit in FIG. 1.

FIG. 2 is a timing chart showing the operation of the circuit in FIG. 1.

When the source clock (clk) is supplied to the PLL circuit 10 and the FF 15, the phase detector 11 detects the phase difference between the source clock (clk) and the feedback clock S14 from the divider 14 and outputs a voltage proportional to the phase difference. The LPF 12 smoothes the output voltage of the phase detector 11 and takes out a voltage component proportional to the phase difference. The VCO 13 outputs the PLL clock pll_clk with an oscillation frequency controlled by the output voltage of the LPF 12. The divider 14 divides the PLL clock pll_clk by a multiplication factor N (for example, N=5) to generate a feedback clock S14 and feeds it back to the phase detector 11.

In such a feedback control, the phase of the feedback clock S14 is controlled so that it approaches the phase of the source clock (clk) and finally the difference between the two phases become a constant value. When the frequency f0 of the feedback clock S14 is sufficiently close to the frequency fi of the source clock (clk), the frequency f0 is locked onto the frequency fi (that is, the frequency of the PLL clock pll_clk is stabilized) so that the phase difference becomes constant and the frequency difference disappears. The gate circuit 25 is closed until the frequency of the PLL clock pll_clk is stabilized.

In the period until the frequency of the PLL clock pll_clk output from the VCO 13 is stabilized, when the PLL clock pll_clk is supplied to the FF 15 and the counter 17, the FF 15 synchronizes the source clock (clk) with the PLL clock pll_clk. That is, the FF 15 latches the high level "H" of the source clock (clk) in synchronization with the rising edge of the PLL clock pll_clk to output a signal of high level "H", and latches the low level "L" of the source clock (clk) in synchronization with the falling edge of the PLL clock pll_clk to perform synchronization of the source clock (clk) with the PLL clock pll_clk. The divider 16 divides the output signal of the FF 15 by two to generate a synchronous reset signal S16, which is supplied to the reset terminal R of the counter 17 and to the counter 20 as a clock.

The counter value of the counter 17 is reset, for example, from five to zero when the synchronous reset signal S16 goes a logical value "1". When the synchronous reset signal S16 goes a logical value "0", the counter 17 starts counting up on the rising edge of the PLL clock pll_clk and outputs a count value to the comparator 18. The comparator 18 compares a count value of the counter 17 with a PLL multiplication factor N (for example, N=5). When the count value equals to five, the comparator 18 outputs the count enable signal S18 as a logical value "1" and supplies it to the reset terminal R of the counter 20. The selector 22 in the counter 20 thereby selects the output signal of the adder 21, so that the FF 23 latches the output signal of the selector 22 in synchronization with the rising edge of the synchronous reset signal S16, and the counter 20 continues to count up.

When the cycle of the PLL clock pll_clk is shorter due to an unstable operation of the PLL circuit 10, the counter 17 gains count. Therefore, the logical value "1" of the count enable signal S18 moves to a position shown by a dashed line in FIG. 2. In contrast, when the cycle of the PLL clock pll_clk is longer, the counter 17 loses count. Therefore, a logical value "1" is input to the counter 17 from the FF 16 before the counter 17 counts to five (5), and clears the count of the counter 17, so the logical value "1" of the count enable signal S18 is not output.

In both cases, since the count enable signal S18 is a logical value "0" when the synchronous reset signal S16 goes high, the selector 22 in the counter 20 selects the logical value "0" for output. Therefore, the FF 23 latches a logical value "0" on the rising edge of the synchronous reset signal S16, resetting the count of the counter 20 to zero "0."

The comparator 24 compares a count value of the counter 20 with the number of times K the circuit waits for stability. If the count value exceeds the number of times K, the comparator 24 outputs an output enable signal "enable." Thus, it can be determined from the count value of the counter 20 whether the PLL circuit 10 has been stabilized or not. That is, since the count value of the counter 20 is zero in the reset state and does not exceed the number of times K the circuit waits for stability, it can be determined from the count value whether the PLL circuit 10 has been stabilized or not. When the PLL circuit is stabilized, the comparator 24 outputs the output enable signal "enable" to open the gate circuit 25, whereby a stable PLL clock PLL_CLK is output and supplied to logic circuits and other circuits in the next stage.

(Effect)

In the first embodiment, since the multiplication factor N is set to, for example, five (5), the frequency of the PLL clock pll_clk is measured by the counter 20 and comparator 24 at every two cycles of the source clock (clk). It can thus be detected on the LSI that the PLL circuit 10 has been stabilized.

SECOND EMBODIMENT (Structure)

Figure 3:
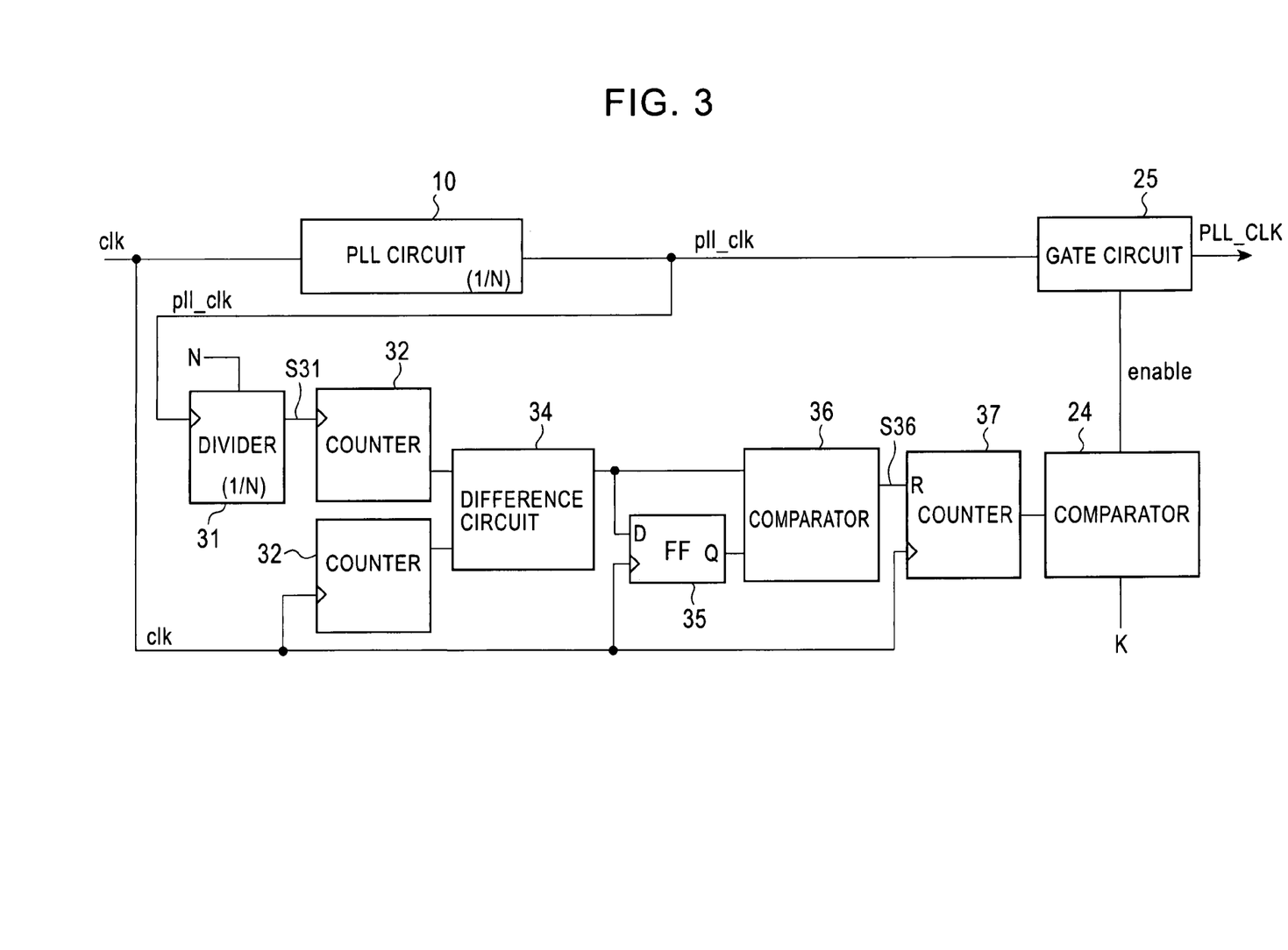
FIG. 3 is a circuit block diagram schematically showing the PLL output clock stabilization circuit according to a second embodiment of the invention.

FIG. 3 is a circuit block diagram schematically showing a PLL output clock stabilization circuit according to a second embodiment of the present invention, in which like reference characters and numerals indicate like elements in FIG. 1 showing the first embodiment.

This PLL output clock stabilization circuit includes the same PLL circuit 10 as in the first embodiment and output means comprising the same comparator 24 and gate circuit 25 as in the first embodiment. The output of the PLL circuit 10 is connected to detection means different from the circuit in the first embodiment, the detection means comprising a divider 31, first and second counters 32 and 33, a difference circuit 34, a FF 35, and a comparator 36. The output of the detection means is connected to count means comprising a third counter 37, the output terminal of which is connected to the comparator 24.

The divider 31 in the detection means counts up with the PLL clock pll_clk, and outputs a divided clock S31, which is a reset signal, when the count matches a PLL multiplication factor N (for example, N=5). The output terminal of the divider 31 is connected to a clock input terminal of the counter 32, which is an up-counter that counts up with the divided clock S31. The counter 33 is an up-counter that counts up with the source clock (clk). The output terminals of the counters 32 and 33 are connected to the difference circuit 34.

The difference circuit 34 detects and outputs the difference between the count values of the counters 32 and 33, and has an output terminal connected to a data input terminal D of the FF 35. The FF 35 latches the output signal of the difference circuit 34 on the rising edge of the source clock (clk), and has an output terminal connected along with the output terminal of the difference circuit 34 to the comparator 36. The comparator 36 compares the output signal of the difference circuit 34 with the output signal of the FF 35 to output a count enable signal S36, and has an output terminal connected to a reset terminal R of the counter 37. Similar to the counter 20 in the first embodiment, the counter 37 is an up-counter with synchronous reset that counts up in synchronization with the rising edge of the source clock (clk), and has an output terminal connected to the comparator 24.

(Operation)

Figure 4:
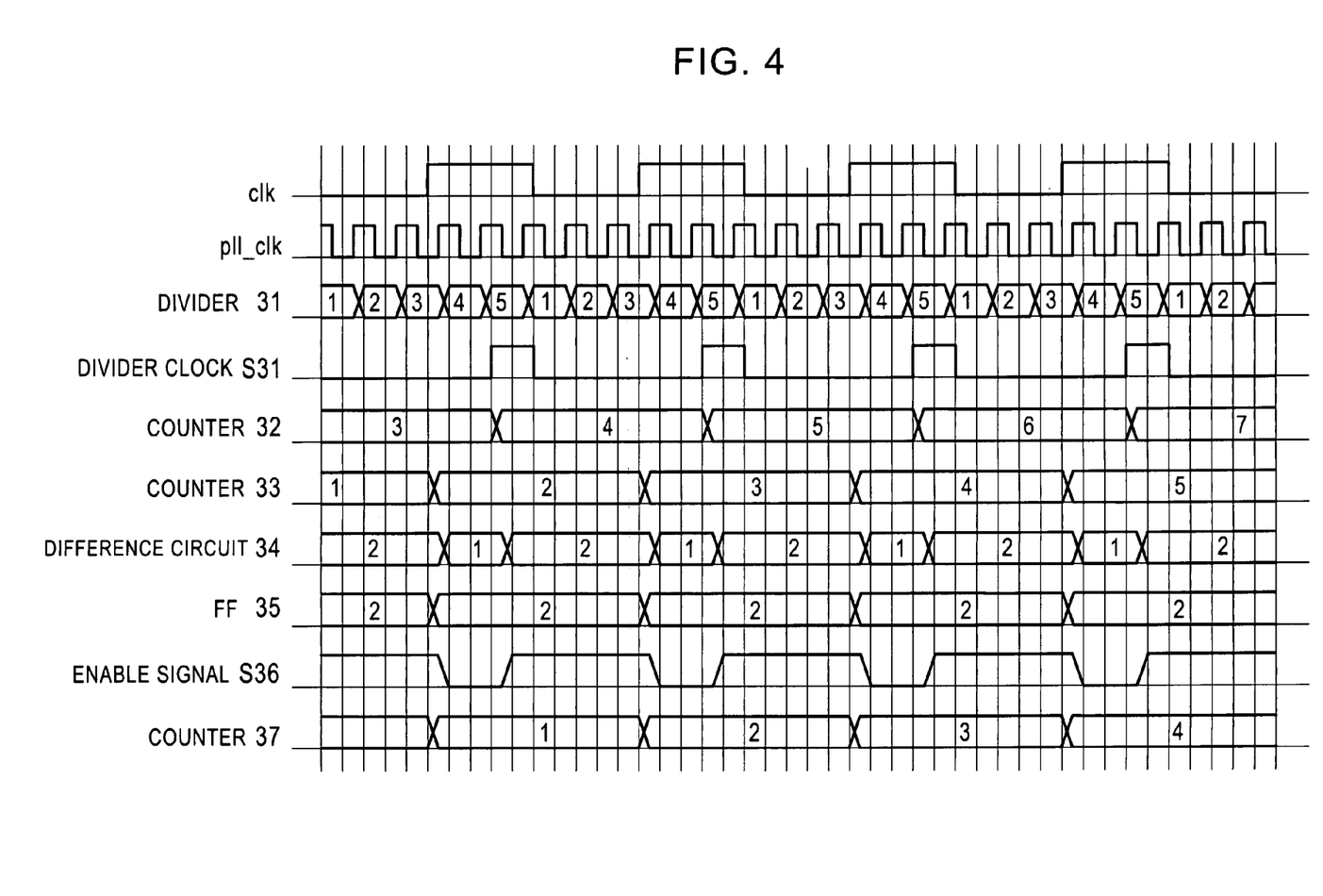
FIG. 4 is a timing chart showing the operation of the circuit in FIG. 3.

FIG. 4 is a timing chart showing the operation of the circuit in FIG. 3.

When the PLL circuit 10 receives the source clock (clk), the PLL circuit 10 outputs a PLL clock pll_clk having an unstable frequency corresponding to that of the source clock (clk) multiplied by a PLL multiplication factor N (for example, N=5). When the PLL circuit 10 is in the initial stage of operation, however, the PLL clock pll_clk is blocked by the gate circuit 25 because the frequency of the PLL circuit 10 is unstable.

In the period until the frequency of the PLL clock pll_clk is stabilized, when the divider 31 receives the PLL clock pll_clk, the divider 31 divides the PLL clock pll_clk by the PLL multiplication factor N (for example, N=5) in synchronization with the rising edge of the PLL clock pll_clk to output the divided clock S31. Although the divided clock S31 is obtained by dividing the PLL clock pll_clk by the PLL multiplication factor N (for example, N=5), its frequency does not match the frequency of the source clock (clk) because the frequency of the PLL clock pll_clk is unstable. The counter 32 counts up in synchronization with the rising edge of the divided clock S31, whereas the counter 33 counts up in synchronization with the rising edge of the source clock (clk). The difference between a counter value (for example, four) of the counter 32 and a counter value (for example, two) of the counter 33 is detected by the difference circuit 34 as a difference value (in this case, two), which is latched and stored in the FF 35 in synchronization with the rising edge of the source clock (clk).

The comparator 36 compares a difference value output from the difference circuit 34 with an output value from the FF 35, which is a difference value in the immediately previous clock cycle, and generates a count enable signal S36 (for example, low level "L" or logical zero "0") as a comparison result. When the count enable signal S36 is a logical value "0", the counter 37 is reset to zero and does not count up as in the first embodiment.

As the PLL circuit 10 becomes stable, since the divider 31 divides the PLL clock pll_clk by the same multiplication factor N (for example, N=5) as in the PLL circuit 10, the frequency of the divided clock S31 becomes equal to that of the source clock (clk). The difference between the output values of the counters 32 and 33 that count up with an equal frequency is detected by the difference circuit 34 as a constant difference value as long as it is detected on the either edge of their clocks. Therefore, when the comparator 36 compares a difference value output from the difference circuit 34 with a difference value which has been stored in the FF 35 in the immediately previous clock cycle, the two matches each other, so that the comparator 36 outputs the count enable signal S36 indicating a comparison result as a logical value "1" (i.e., "H"). The counter 37 thereby counts up on the rising edge of the source clock (clk) as in the first embodiment, and then the comparator 24 compares a count value of the counter 37 with the number of times K the circuit waits for stability. When the count value reaches the number of times K, the comparator 24 outputs an output enable signal "enable."

As described above, when the comparator 36 compares an output value of the difference circuit 33 with a difference value latched in the immediately previous clock cycle and if the two values continue to match each other, it can be determined that the PLL circuit 10 has been stabilized. Subsequently, the comparator 24 outputs the output enable signal "enable," by which the gate circuit 25 is opened to output a stable PLL clock PLL_CLK, which is supplied to logic circuits and other circuits in the next stage.

(Advantage)

The first embodiment does not operate normally when the multiplication factor N equals one (N=1), whereas the second embodiment operates normally by bypassing the divider 31. Furthermore, the second embodiment can properly work by dividing the reference clock (clk) even when adopting the multiplication factor which becomes an integer number by being multiplied by an integer number (for example, N=1.5 or generally N=n/m, where n and m are integer numbers).

THIRD EMBODIMENT (Structure)

Figure 5:
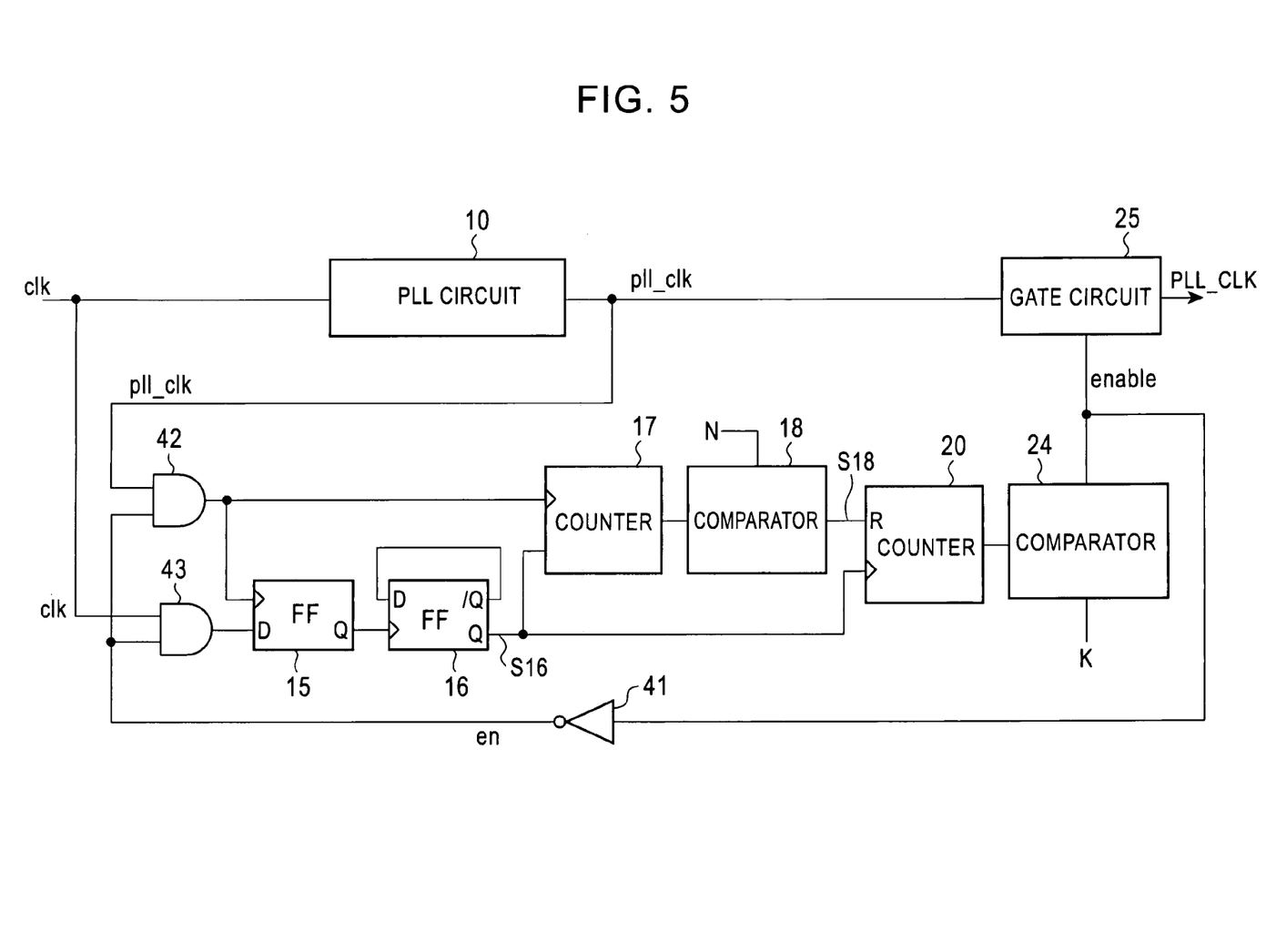
FIG. 5 is a circuit block diagram schematically showing the PLL output clock stabilization circuit according to a third embodiment of the invention.

FIG. 5 is a circuit block diagram schematically showing a PLL output clock stabilization circuit according to a third embodiment of the present invention, in which like reference characters and numerals indicate like elements in FIG. 1 showing the first embodiment.

The PLL output clock stabilization circuit of the third embodiment includes additional clock blocking means for blocking the supply of the PLL clock pll_clk and the source clock (clk) to the FF 15 and the counter 17 in the first embodiment by the output enable signal "enable." The clock blocking means comprises, for example, an inverter 41 and two-input AND gates 42 and 43. The inverter 41 inverts the output enable signal "enable" to generate a clock enable signal "en." The two-input AND gates 42 and 43 pass or block the PLL clock pll_clk and the source clock (clk), respectively, according to the clock enable signal "en."

(Operation)

When the PLL circuit 10 is in the initial stage of operation, since the frequency of the PLL clock pll_clk is unstable, the comparator 24 outputs the output enable signal "enable" that is, for example, the low level ("0"), by which the gate circuit 25 is closed. The inverter 41 inverts this output enable signal "enable" and outputs the clock enable signal "en" that is the high level ("1"), by which the AND gates 42 and 43 are opened. The PLL clock pll_clk is thereby supplied to the FF 15 and the counter 17 and the source clock (clk) to the FF 15, so that the part of the circuit blocks in FIG. 5, which serves as a circuit for waiting the stability of the PLL circuit 10, starts to operate.

When the frequency of the PLL clock pll_clk becomes stable, the comparator 24 outputs the output enable signal "enable" that is the high level ("1"), by which the gate circuit 25 is opened to output a stable PLL clock PLL_CLK, which is supplied to logic circuits and other circuits in the next stage. Simultaneously, the inverter 41 inverts this output enable signal "enable" and outputs the clock enable signal "en" that is the low level ("0"), by which the AND gates 42 and 43 are closed. Since the supply of the PLL clock pll_clk and the source clock (clk) to the FF 15 and the counter 17 is thereby blocked; the part of the circuit blocks in FIG. 5, which serves as a circuit for waiting the stability of the PLL circuit, stops to operate, thereby cutting the power consumption of the circuit for waiting the PLL stability.

(Advantage)

Since the part of the circuit blocks in FIG. 5, which serves as a circuit for waiting the PLL stability, is used only during the unstable set-up period of the PLL circuit 10, the power consumption when using the PLL clock PLL_CLK can be reduced in such a way that at first this part of the circuit blocks is allowed to operate by driving the clock enable signal "en" to a logical value "1" and then the operation is stopped by driving the clock enable signal "en" to a logical value "0" after the PLL circuit 10 has been stabilized.

FOURTH EMBODIMENT

The present invention is not limited to the above first to third embodiments, but various modifications will be possible. A fourth embodiment includes, for example, the following modifications (a) and (b).

(a) It has been described that the PLL multiplication factor N has a fixed value, but using a variable divider or other circuits enables various PLL multiplication factors N to be set during the non-operational state, whereby a plurality of multiplication factors N can be used.

(b) The part of the circuit blocks for detecting the stability of the PLL circuit operates in synchronization with the rising edges of the clocks clk and pll_clk, but it may be modified so as to operate in synchronization with the falling edges thereof, thereby obtaining substantially the same effects.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Application No. 2004-215200 which is hereby incorporated by reference.

What is claimed is:

1. A PLL output clock stabilization circuit comprising:
    a PLL circuit which multiplies a reference clock by a fixed or variable multiplication factor to output a PLL clock;
    a first counter which counts up with the PLL clock for a fixed period of time;
    a comparator which compares a count value of the first counter with the fixed or variable multiplication factor;
    a second counter which counts up the number of times the comparison values of the comparator have been continuously matched for the fixed period of time; and
    output means which generates an output enable signal when a count value of the second counter reaches a fixed value, and opens a gate, by which the PLL clock has been blocked, to transmit the PLL clock in response to the output enable signal.

2. The PLL output clock stabilization circuit according to claim 1, wherein
    the fixed period of time is set by a flip-flop which receives the PLL clock and the reference clock to synchronize the reference clock with an edge of the PLL clock and a divider which divides an output signal of the flip-flop.

3. The PLL output clock stabilization circuit according to claim 2, further comprising clock blocking means which blocks the supply of the PLL clock and the reference clock to the flip-flop and the first counter by an inverted signal of the output enable signal.

4. The PLL output clock stabilization circuit according to claim 1, wherein the output means comprises:
 a comparator which compares the count value of the second counter with the fixed value and outputs the output enable signal when the comparison values are matched; and
 a gate circuit which opens the gate, by which the PLL clock has been blocked, in response to the output enable signal.

* * * * *